(12) United States Patent
Golda et al.

(10) Patent No.: US 9,255,001 B2
(45) Date of Patent: Feb. 9, 2016

(54) MICRO DEVICE TRANSFER HEAD ARRAY WITH METAL ELECTRODES

(71) Applicant: LuxVue Technology Corporation, Santa Clara, CA (US)

(72) Inventors: Dariusz Golda, Redwood City, CA (US); Andreas Bibl, Los Altos, CA (US)

(73) Assignee: LuxVue Technology Corporation, Santa Clara, CA (US)

( * ) Notice: Subject to any disclaimer, the term of this patent is extended or adjusted under 35 U.S.C. 154(b) by 492 days.

(21) Appl. No.: 13/710,438

(22) Filed: Dec. 10, 2012

(65) Prior Publication Data

US 2014/0158415 A1    Jun. 12, 2014

(51) Int. Cl.
*H05K 1/00* (2006.01)
*B81C 99/00* (2010.01)

(52) U.S. Cl.
CPC .................... *B81C 99/002* (2013.01)

(58) Field of Classification Search
CPC ............... H01L 21/00; H01L 29/00
USPC .......... 174/252, 250, 255, 261, 262; 361/234; 257/619, 623, 774, E29.324, 288; 438/128, 130, 158, 250, 251, 253, 254, 438/261, 263, 276, 30, 39, 396
See application file for complete search history.

(56) References Cited

U.S. PATENT DOCUMENTS

| | | |
|---|---|---|
| 4,837,176 A | 6/1989 | Zdebel et al. |
| 5,067,002 A | 11/1991 | Zdebel et al. |
| 5,110,752 A | 5/1992 | Lu |
| 5,266,514 A | 11/1993 | Tuan et al. |
| 5,426,558 A | 6/1995 | Sherman |
| 5,592,358 A | 1/1997 | Shamouilian et al. |
| 5,640,133 A | 6/1997 | MacDonald et al. |
| 5,745,331 A | 4/1998 | Shamouilian et al. |
| 5,839,187 A | 11/1998 | Sato et al. |
| 5,851,664 A | 12/1998 | Bennett et al. |
| 5,888,847 A | 3/1999 | Rostoker et al. |
| 5,903,428 A | 5/1999 | Grimard et al. |
| 5,996,218 A | 12/1999 | Shamouilian et al. |
| 6,071,795 A | 6/2000 | Cheung et al. |
| 6,096,368 A | 8/2000 | Sun |

(Continued)

FOREIGN PATENT DOCUMENTS

JP         3406207        5/1999
JP    2004-079745 A      3/2004

(Continued)

OTHER PUBLICATIONS

LuxVue Technology Corporation Notice of Allowance for U.S. Appl. No. 14/221,071 mailed Feb. 9, 2015.

(Continued)

*Primary Examiner* — Tremesha S Willis
(74) *Attorney, Agent, or Firm* — Blakely, Sokoloff, Taylor & Zafman LLP

(57) ABSTRACT

A monopolar and bipolar micro device transfer head array and method of forming a monopolar and bipolar micro device transfer array are described. In an embodiment, a micro device transfer head array includes a base substrate, a first insulating layer formed over the base substrate, and an array of mesa structures. A second insulating layer may be formed over the mesa structure, a patterned metal layer over the second insulating layer, and a dielectric layer covering the metal layer.

21 Claims, 11 Drawing Sheets

(56) References Cited

U.S. PATENT DOCUMENTS

| | | |
|---|---|---|
| 6,335,263 B1 | 1/2002 | Cheung et al. |
| 6,379,929 B1 | 4/2002 | Burns et al. |
| 6,403,985 B1 | 6/2002 | Fan et al. |
| 6,420,242 B1 | 7/2002 | Cheung et al. |
| 6,521,511 B1 | 2/2003 | Inoue et al. |
| 6,558,109 B2 | 5/2003 | Gibbel |
| 6,613,610 B2 | 9/2003 | Iwafuchi et al. |
| 6,629,553 B2 | 10/2003 | Odashima et al. |
| 6,670,038 B2 | 12/2003 | Sun et al. |
| 6,786,390 B2 | 9/2004 | Yang et al. |
| 6,825,105 B2 | 11/2004 | Grover et al. |
| 6,878,607 B2 | 4/2005 | Inoue et al. |
| 7,033,842 B2 | 4/2006 | Haji et al. |
| 7,148,127 B2 | 12/2006 | Oohata et al. |
| 7,208,337 B2 | 4/2007 | Eisert et al. |
| 7,335,527 B2 | 2/2008 | Sawyer et al. |
| 7,353,596 B2 | 4/2008 | Shida et al. |
| 7,358,158 B2 | 4/2008 | Aihara et al. |
| 7,585,703 B2 | 9/2009 | Matsumura et al. |
| 7,622,367 B1 | 11/2009 | Nuzzo et al. |
| 7,723,764 B2 | 5/2010 | Oohata et al. |
| 7,785,481 B2 | 8/2010 | Wang |
| 7,795,629 B2 | 9/2010 | Watanabe et al. |
| 7,797,820 B2 | 9/2010 | Shida et al. |
| 7,829,366 B2 | 11/2010 | Miller et al. |
| 7,838,410 B2 | 11/2010 | Hirao et al. |
| 7,880,184 B2 | 2/2011 | Iwafuchi et al. |
| 7,884,543 B2 | 2/2011 | Doi |
| 7,888,690 B2 | 2/2011 | Iwafuchi et al. |
| 7,906,787 B2 | 3/2011 | Kang |
| 7,910,945 B2 | 3/2011 | Donofrio et al. |
| 7,927,976 B2 | 4/2011 | Menard |
| 7,928,465 B2 | 4/2011 | Lee et al. |
| 7,929,195 B2 | 4/2011 | Bifano |
| 7,943,497 B2 | 5/2011 | Nakai |
| 7,972,875 B2 | 7/2011 | Rogers et al. |
| 7,982,296 B2 | 7/2011 | Nuzzo et al. |
| 7,999,454 B2 | 8/2011 | Winters et al. |
| 8,023,248 B2 | 9/2011 | Yonekura et al. |
| 8,333,860 B1 | 12/2012 | Bibl et al. |
| 8,383,506 B1 | 2/2013 | Golda et al. |
| 8,415,767 B1 | 4/2013 | Golda et al. |
| 8,415,768 B1 | 4/2013 | Golda et al. |
| 8,415,771 B1 | 4/2013 | Golda et al. |
| 8,440,546 B2 | 5/2013 | Nuzzo et al. |
| 8,506,867 B2 | 8/2013 | Menard |
| 8,569,115 B1 | 10/2013 | Golda et al. |
| 8,664,699 B2 | 3/2014 | Nuzzo et al. |
| 8,686,542 B2 | 4/2014 | Golda et al. |
| 8,716,767 B2 | 5/2014 | Golda et al. |
| 8,791,530 B2 | 7/2014 | Bibl et al. |
| 8,865,489 B2 | 10/2014 | Rogers et al. |
| 8,877,648 B2 | 11/2014 | Bower et al. |
| 8,889,485 B2 | 11/2014 | Bower |
| 8,934,259 B2 | 1/2015 | Bower et al. |
| 2001/0029088 A1 | 10/2001 | Odajima et al. |
| 2002/0022308 A1 | 2/2002 | Ahn et al. |
| 2002/0076848 A1 | 6/2002 | Spooner et al. |
| 2002/0168671 A1 | 11/2002 | Burns et al. |
| 2002/0172969 A1 | 11/2002 | Burns et al. |
| 2003/0022474 A1 | 1/2003 | Grover et al. |
| 2003/0177633 A1 | 9/2003 | Haji et al. |
| 2004/0056307 A1 | 3/2004 | Cho et al. |
| 2004/0124490 A1 | 7/2004 | Bohr et al. |
| 2004/0161943 A1 | 8/2004 | Ren et al. |
| 2007/0166851 A1 | 7/2007 | Tran et al. |
| 2008/0023841 A1* | 1/2008 | Nakasato et al. ............ 257/773 |
| 2008/0048520 A1 | 2/2008 | Gulvin et al. |
| 2008/0163481 A1 | 7/2008 | Shida et al. |
| 2008/0280069 A1 | 11/2008 | Parce et al. |
| 2009/0068774 A1 | 3/2009 | Slater et al. |
| 2009/0090693 A1 | 4/2009 | Wang |
| 2009/0218642 A1 | 9/2009 | Miller et al. |
| 2009/0314991 A1 | 12/2009 | Cho et al. |
| 2010/0039747 A1 | 2/2010 | Sansoni et al. |
| 2010/0046134 A1 | 2/2010 | Mizuno et al. |
| 2010/0142114 A1 | 6/2010 | Purohit et al. |
| 2010/0149720 A1 | 6/2010 | Fujisawa et al. |
| 2010/0188794 A1 | 7/2010 | Park et al. |
| 2010/0248484 A1 | 9/2010 | Bower et al. |
| 2011/0003410 A1 | 1/2011 | Tsay et al. |
| 2011/0121462 A1 | 5/2011 | Kim |
| 2012/0064642 A1 | 3/2012 | Huang et al. |
| 2012/0134065 A1 | 5/2012 | Furuya et al. |
| 2013/0285086 A1 | 10/2013 | Hu et al. |
| 2013/0300812 A1 | 11/2013 | Bibl et al. |
| 2013/0316529 A1 | 11/2013 | Golda et al. |
| 2014/0373898 A1 | 12/2014 | Rogers et al. |

FOREIGN PATENT DOCUMENTS

| | | |
|---|---|---|
| JP | 2006-0148602 | 6/2006 |
| KR | 10-2002-0022557 A | 3/2002 |
| KR | 10-2004-0030610 A | 4/2004 |
| KR | 10-0800825 B1 | 1/2008 |
| MP | 10-2011-0075451 A | 7/2011 |
| WO | WO 2011/123285 | 10/2011 |

OTHER PUBLICATIONS

LuxVue Technology Corporation Office Action for U.S. Appl. No. 14/694,808 mailed May 20, 2015.

LuxVue Technology Corporation Office Action for U.S. Appl. No. 13/710,442 mailed Feb. 9, 2015.

LuxVue Technology Corporation Notice of Allowance for U.S. Appl. No. 13/543,680 mailed Sep. 16, 2013.

LuxVue Technology Corporation Office Action for U.S. Appl. No. 13/828,117 mailed Sep. 11, 2013.

LuxVue Technology Corporation Notice of Allowance for U.S. Appl. No. 13/481,615 mailed Jan. 20, 2015.

LuxVue Technology Corporation Office Action for U.S. Appl. No. 13/481,615 mailed Aug. 20, 2014.

LuxVue Technology Corporation Notice of Allowance for U.S. Appl. No. 14/063,963 mailed Jan. 2, 2014.

LuxVue Technology Corporation Office Action for U.S. Appl. No. 14/221,071 mailed Aug. 20, 2014.

LuxVue Technology Corporation Notice of Allowance for U.S. Appl. No. 13/828,117 mailed Nov. 7, 2013.

LuxVue Technology Corporation Notice of Allowance for U.S. Appl. No. 14/173,693 mailed Nov. 28, 2014.

LuxVue Technology Corporation Office Action for U.S. Appl. No. 14/173,693 mailed Aug. 11, 2014.

Asano, Kazutoshi, et al., "Fundamental Study of an Electrostatic Chuck for Silicon Wafer Handling" IEEE Transactions on Industry Applications, vol. 38, No. 3, May/Jun. 2002, pp. 840-845.

Bower, C.A., et al., "Active-Matrix OLED Display Backplanes Using Transfer-Printed Microscale Integrated Circuits", IEEE, 2010 Electronic Components and Technology Conference, pp. 1339-1343.

"Characteristics of electrostatic Chuck(ESC)" Advanced Materials Research Group, New Technology Research Laborotory, 2000, pp. 51-53 accessed at http://www.socnb.com/report/ptech_e/2000p51_e.pdf.

Guerre, Roland, et al, "Selective Transfer Technology for Microdevice Distribution" Journal of Microelectromechanical Systems, vol. 17, No. 1, Feb. 2008, pp. 157-165.

Han, Min-Koo, "AM backplane for AMOLED" Proc. of ASID '06, Oct. 8-12, New Delhi, pp. 53-58.

Harris, Jonathan H., "Sintered Aluminum Nitride Ceramics for High-Power Electronic Applications" Journal of the Minerals, Metals and Materials Society, vol. 50, No. 6, Jun. 1998, p. 56.

Horwitz, Chris M., "Electrostatic Chucks: Frequently Asked Questions" Electrogrip, 2006, 10 pgs, accessed at www.electrogrip.com.

Hossick-Schott, Joachim, "Prospects for the ultimate energy density of oxide-based capacitor anodes" Medtronic Energy and Components Center, 10 pgs.

Lee, San Youl, et al., "Wafer-level fabrication of GAN-based vertical light-emitting diodes using a multi-functional bonding material system" Semicond. Sci. Technol. 24, 2009, 4 pgs.

(56) References Cited

OTHER PUBLICATIONS

"Major Research Thrust: Epitaxial Layer Transfer by Laser Lift-off" Purdue University, Heterogeneous Integration Research Group, accessed at https://engineering.purdue.edu/HetInt/project_epitaxial_layer_transfer_llo.htm, last updated Aug. 2003.
Mei, Zequn, et al., "Low_Temperature Solders" Hewlett-Packard Journal, Article 10, Aug. 1996, pp. 1-10.
Mercado, Lei, L., et al., "A Mechanical Approach to Overcome RF MEMS Switch Stiction Problem" 2003 Electronic Components and Technology Conference, pp. 377-384.
Miskys, Claudio R., et al., "Freestanding GaN-substrates and devices" phys. Stat. sol. © 0, No. 6, 2003, pp. 1627-1650.
"Principles of Electrostatic Chucks: 1—Techniques for High Performance Grip and Release" ElectroGrip, Principles1 rev3 May 2006, 2 pgs, accessed at www.electrogrip.com.
Steigerwald, Daniel, et al., "III-V Nitride Semiconductors for High-Perfromance Blue and Green Light-Emitting Devices" article appears in journal JOM 49 (9) 1997, pp. 18-23. Article accessed Nov. 2, 2011 at http://www.tms.org/pubs/journals/jom/9709/setigerwald-9709.html, 12 pgs.
Widas, Robert, "Electrostatic Substrate Clamping for Next Generation Semiconductor Devices" Apr. 21, 1999, 4 pgs.
LuxVue Technology Corporation Notice of Allowance for U.S. Appl. No. 13/481,592 mailed Dec. 7, 2012.
LuxVue Technology Corporation Office Action for U.S. Appl. No. 13/481,592 mailed Aug. 15, 2012.
LuxVue Technology Corporation Office Action for U.S. Appl. No. 13/543,675 mailed Sep. 24, 2012.
LuxVue Technology Corporation Office Action for U.S. Appl. No. 13/543,684 mailed Sep. 24, 2012.
LuxVue Technology Corporation Notice of Allowance for U.S. Appl. No. 13/543,690 mailed Oct. 22, 2012.
LuxVue Technology Corporation Notice of Allowance for U.S. Appl. No. 13/543,675 mailed Jan. 8, 2013.
LuxVue Technology Corporation Notice of Allowance for U.S. Appl. No. 13/543,684 mailed Jan. 11, 2013.
LuxVue Technology Corporation Office Action for U.S. Appl. No. 14/681,707 mailed Jun. 15, 2015.

* cited by examiner

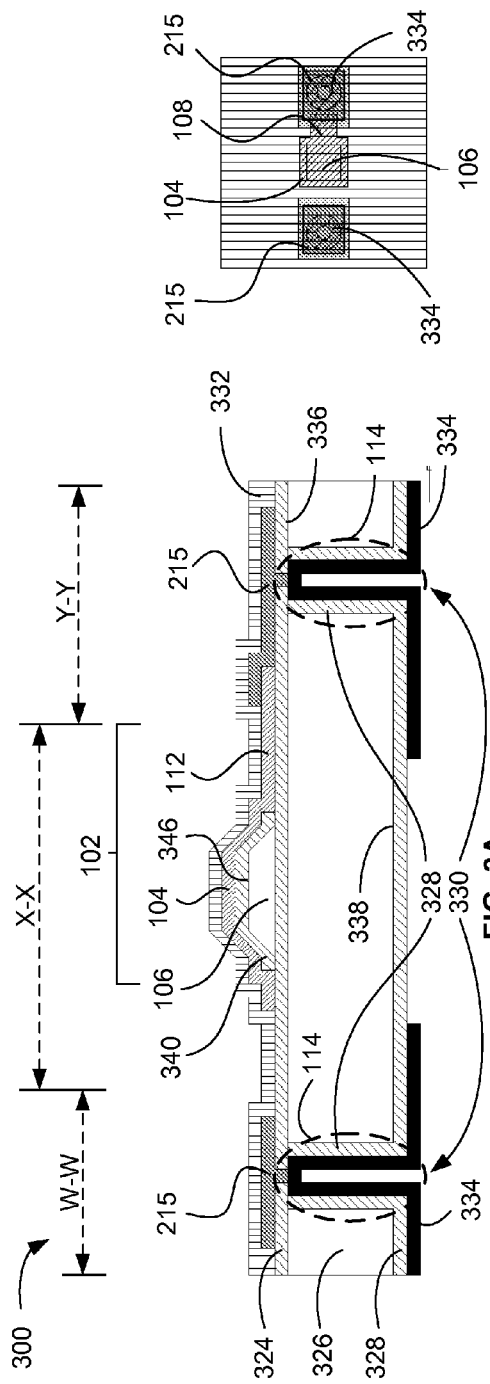

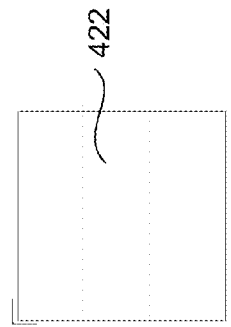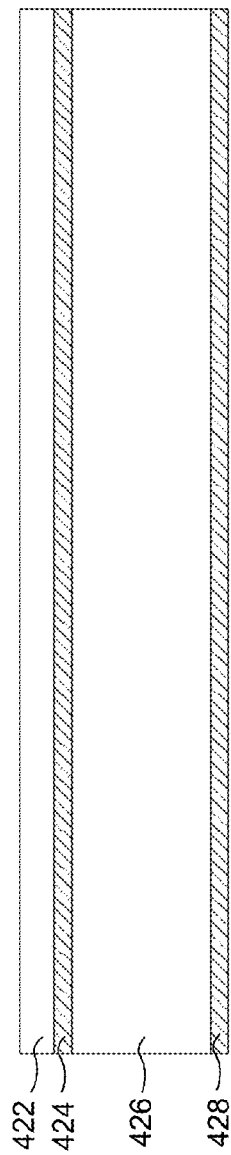
FIG. 5B
FIG. 5A
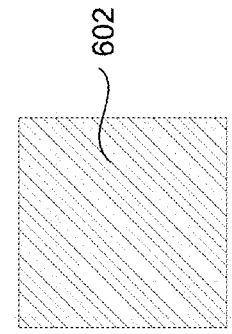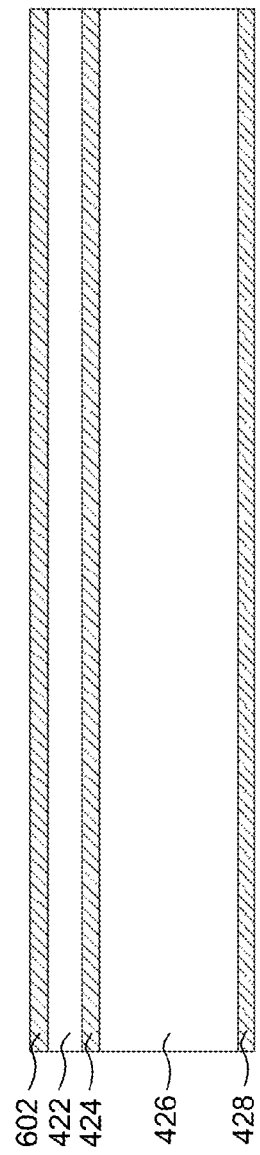
FIG. 6B
FIG. 6A
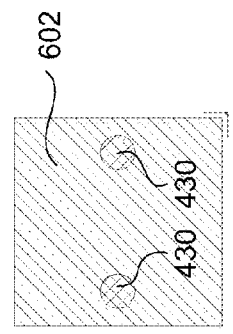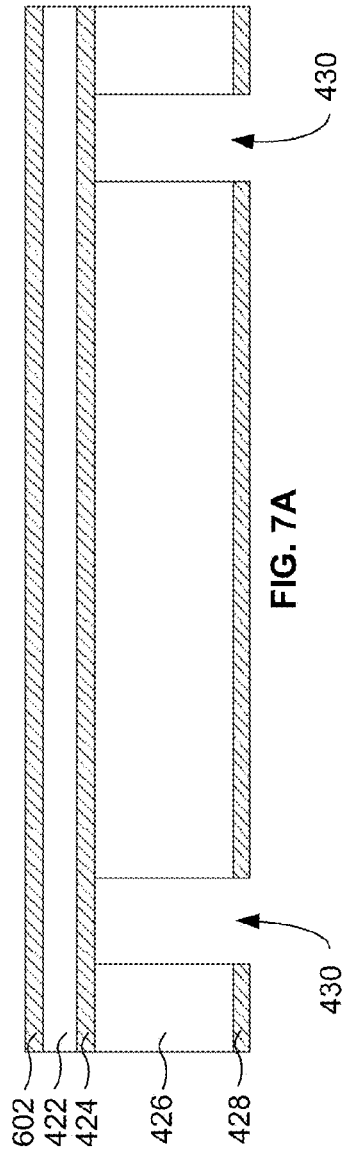
FIG. 7B
FIG. 7A

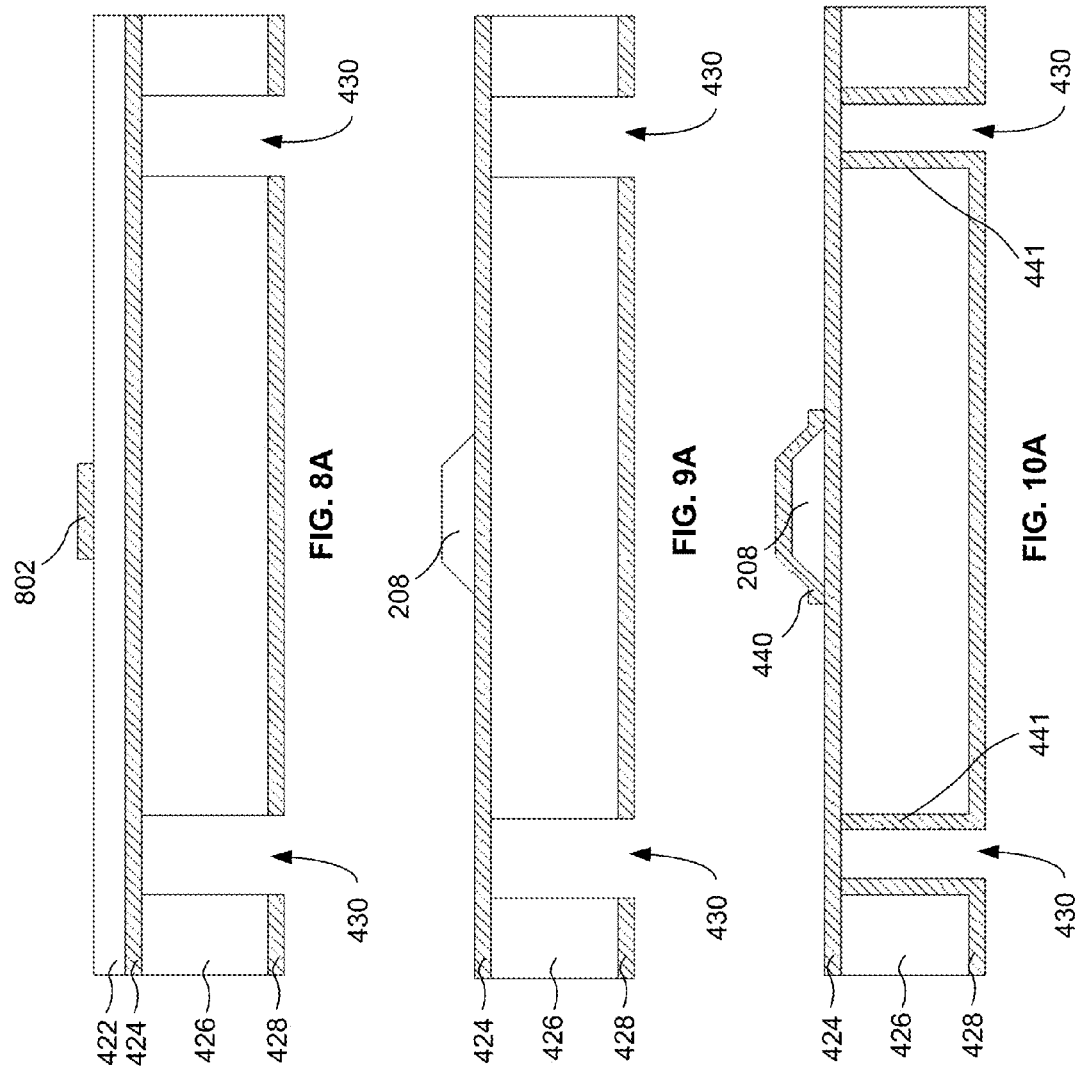

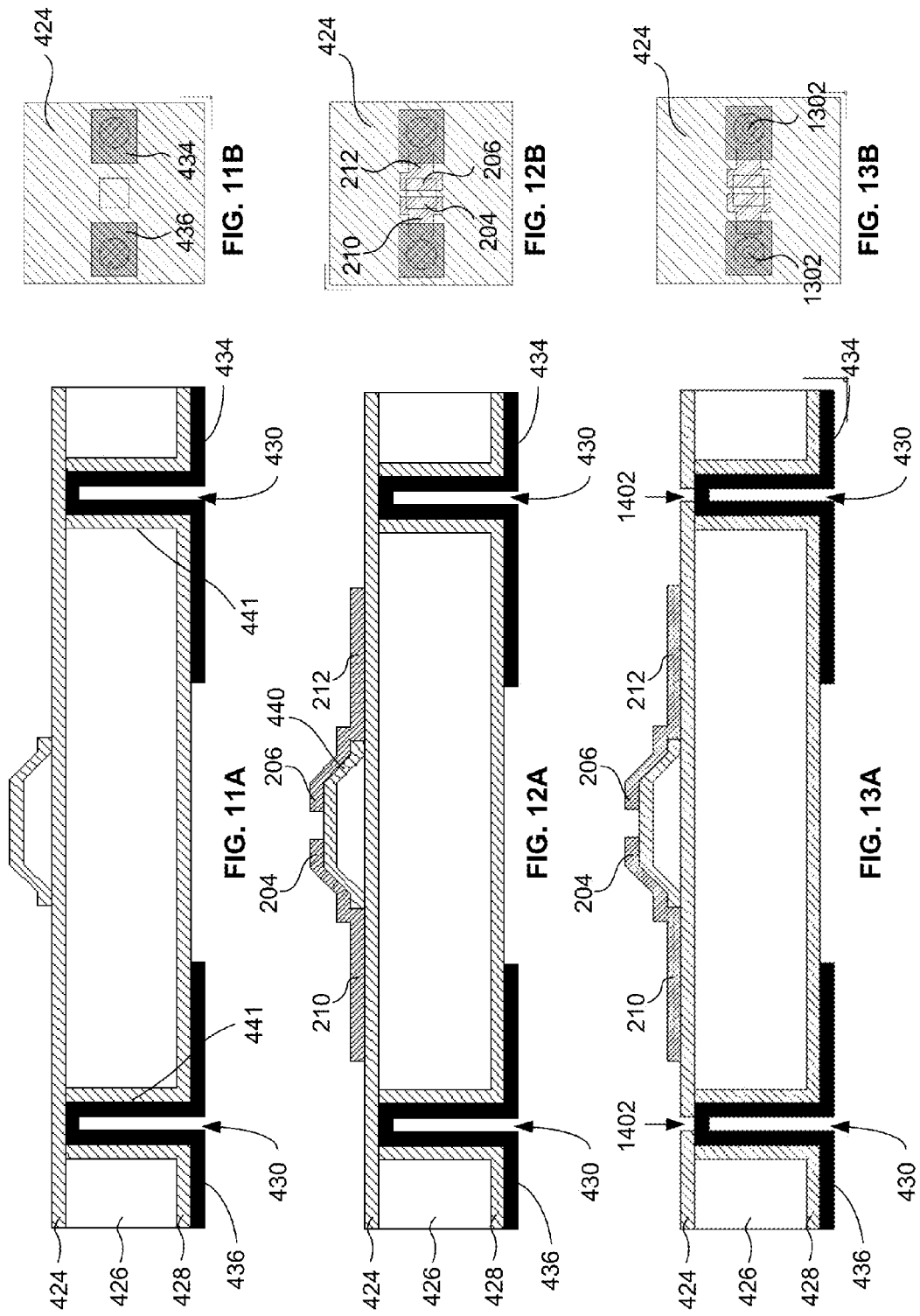

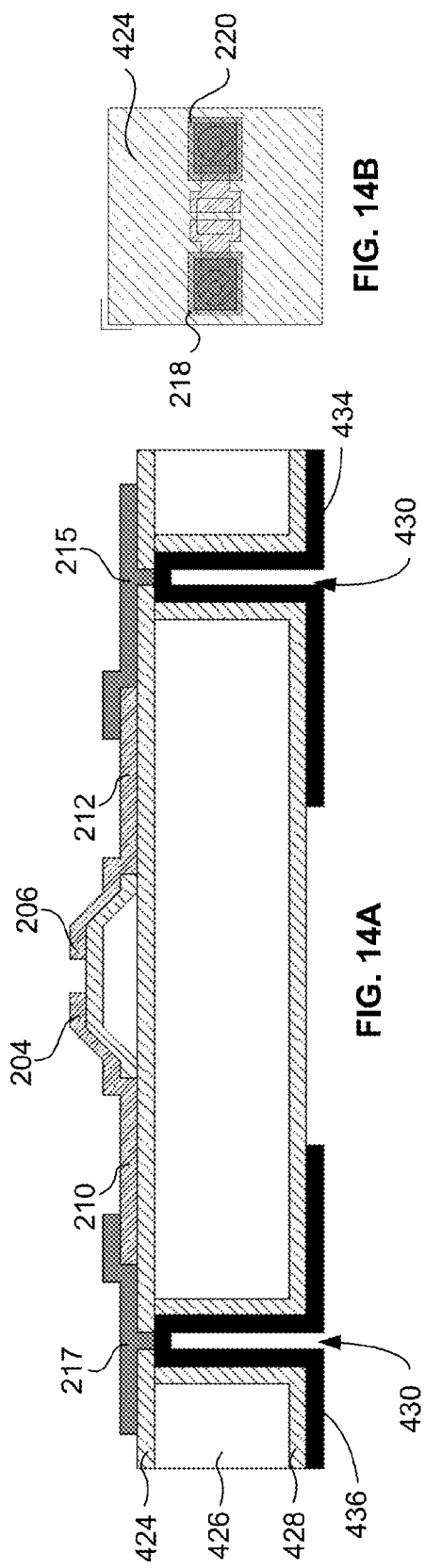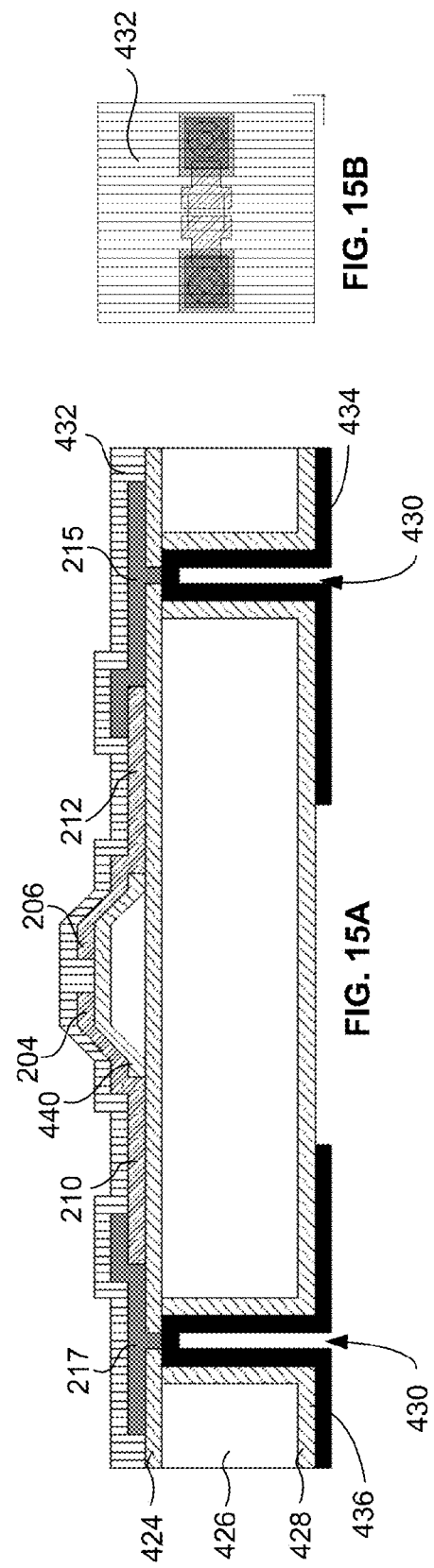

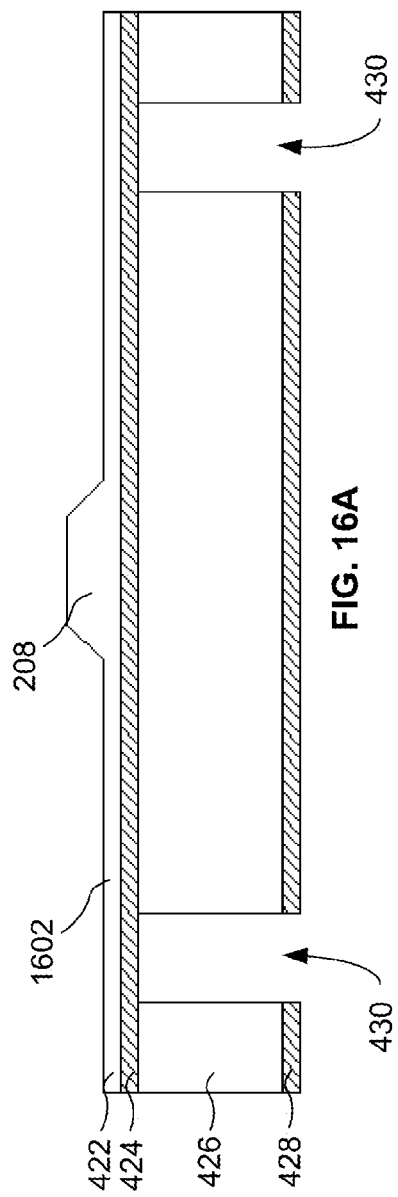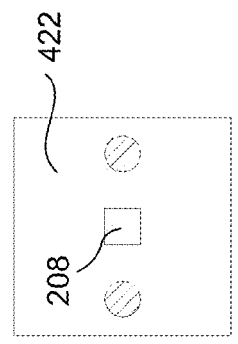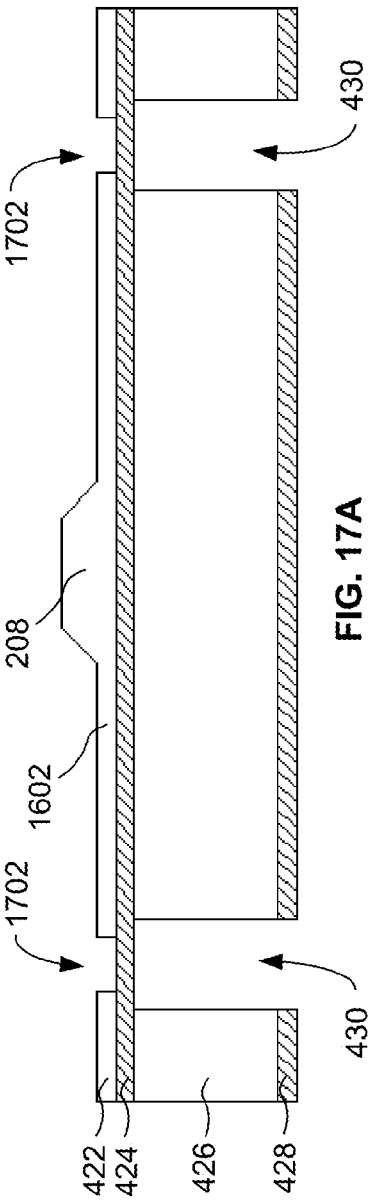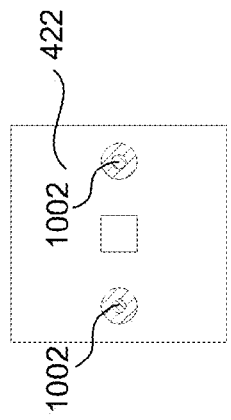

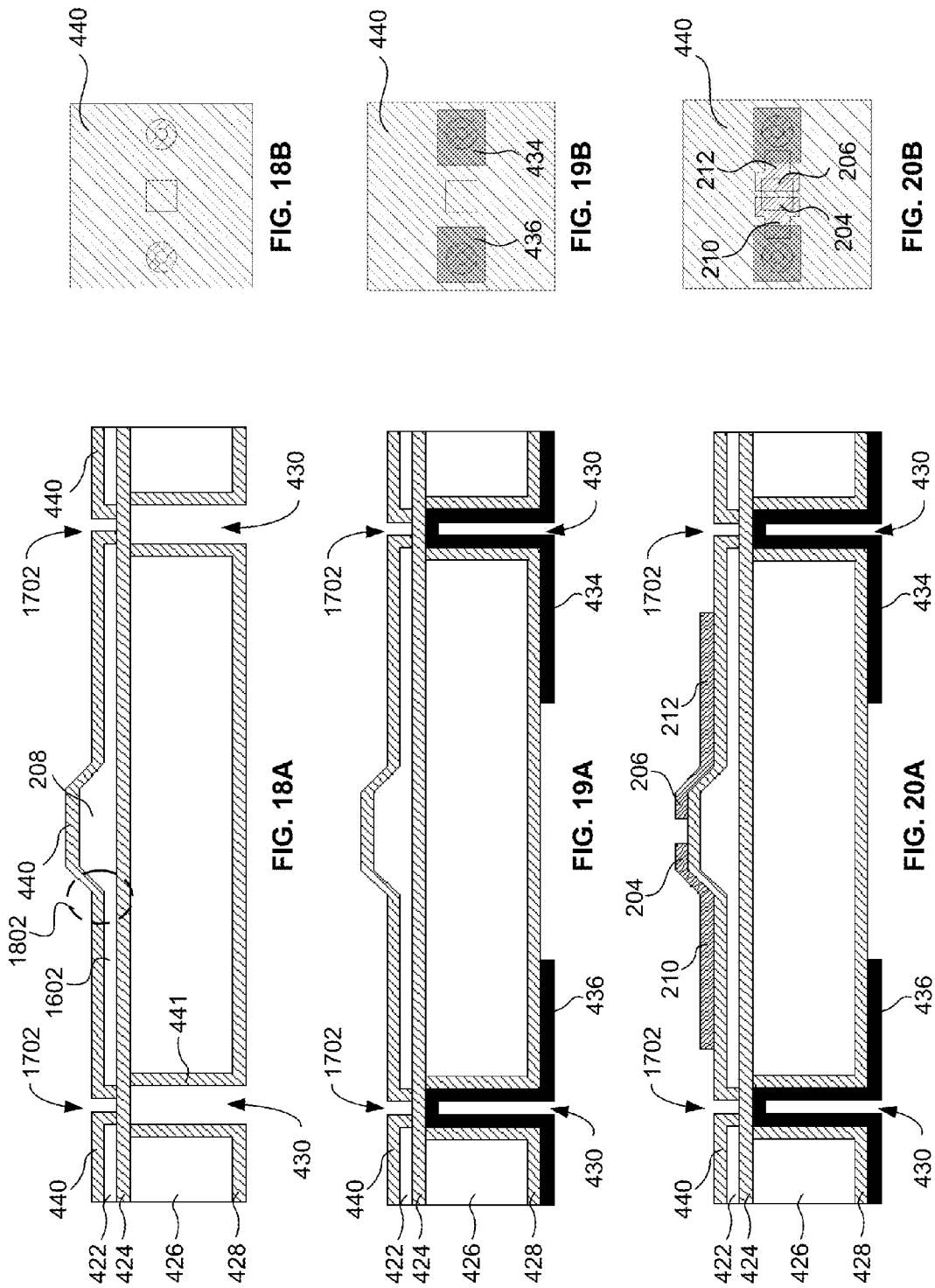

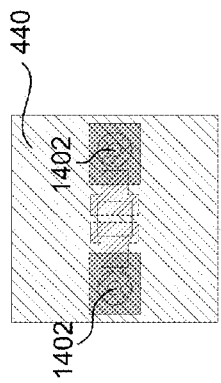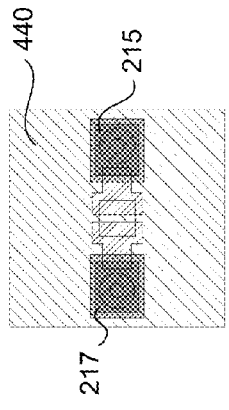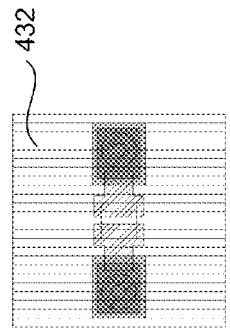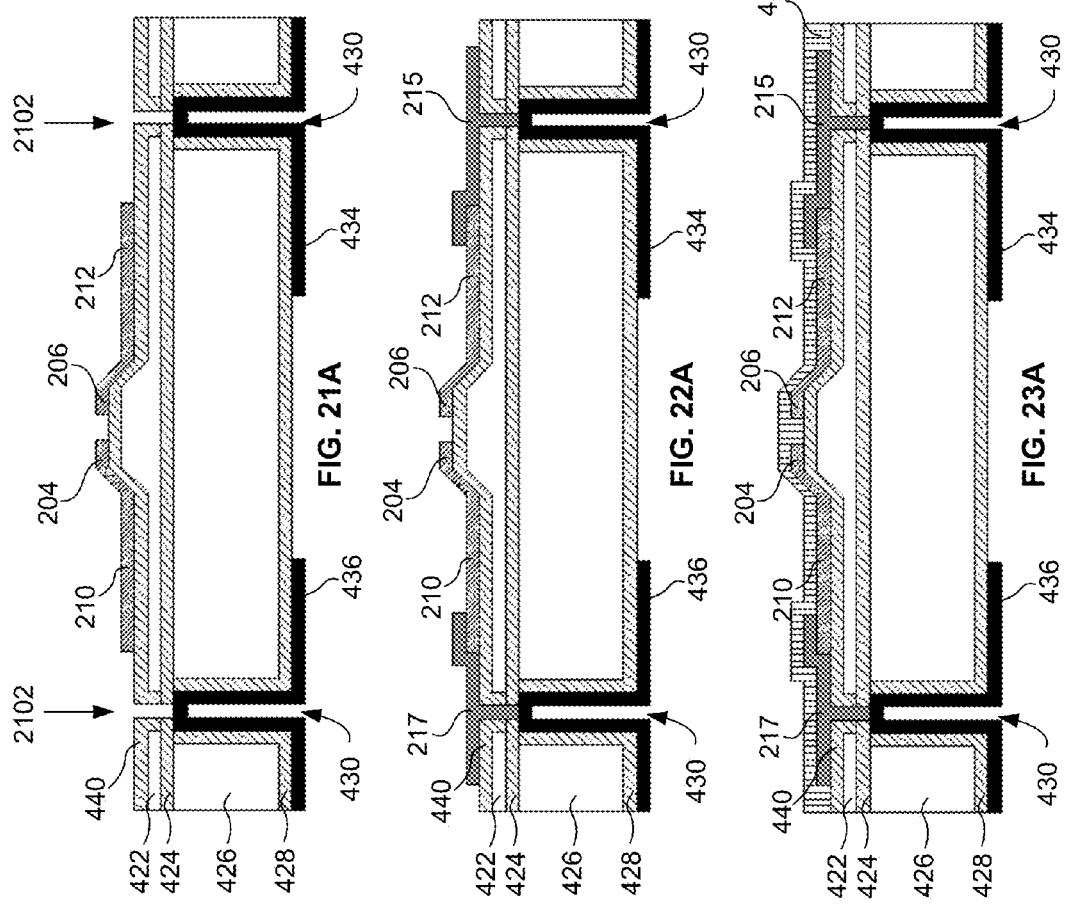

MICRO DEVICE TRANSFER HEAD ARRAY WITH METAL ELECTRODES

BACKGROUND

1. Field

The present invention relates to micro devices. More particularly embodiments of the present invention relate to a micro device transfer head with metal electrodes and a method of transferring one or more micro devices to a receiving substrate.

2. Background Information

Integration and packaging issues are one of the main obstacles for the commercialization of micro devices such as radio frequency (RF) microelectromechanical systems (MEMS) microswitches, light-emitting diode (LED) display systems, and MEMS or quartz-based oscillators.

Traditional technologies for transferring of devices include transfer by wafer bonding from a transfer wafer to a receiving wafer. One such implementation is "direct printing" involving one bonding step of an array of devices from a transfer wafer to a receiving wafer, followed by removal of the transfer wafer. Another such implementation is "transfer printing" involving two bonding/de-bonding steps. In transfer printing a transfer wafer may pick up an array of devices from a donor wafer, and then bond the array of devices to a receiving wafer, followed by removal of the transfer wafer.

Some printing process variations have been developed where a device can be selectively bonded and de-bonded during the transfer process. In both traditional and variations of the direct printing and transfer printing technologies, the transfer wafer is de-bonded from a device after bonding the device to the receiving wafer. In addition, the entire transfer wafer with the array of devices is involved in the transfer process.

SUMMARY OF THE INVENTION

A micro device transfer head and head array, and a method of transferring an array of micro devices are disclosed. In an embodiment, a micro device transfer head array includes a base substrate and an array of mesa structures, with each mesa structure may have a maximum width of 1 to 100 μm. A patterned metal layer is formed over a top surface of each mesa structure, and a dielectric layer covers the patterned metal layer on the top surface of each mesa structure, and a through via extends through the base substrate to provide an operating voltage path to the micro device transfer head array. In an embodiment, the dielectric layer is formed of a high-k dielectric material such as $Al_2O_3$, $HfO_2$, $Ta_2O_5$. An insulating layer may be formed on a side surface of the through via, and a conductive layer formed within the through via and in electrical contact with the patterned metal layer. In some embodiments, the conductive layer does not completely fill the through via. The patterned metal layer may include an array of electrode leads electrically connected with an array of metal electrodes corresponding to the array of mesa structures. In an embodiment, each metal electrode completely covers a top surface of a corresponding mesa structure. In an embodiment, a second through via extends through the base substrate to provide an operating voltage path to the micro device transfer head array. In an embodiment, a second conductive layer is formed within the second through via and in electrical contact with the patterned metal layer. In such an embodiment, the patterned metal lay may include a first array of electrode leads electrically connected with a first array of metal electrodes corresponding to the array of mesa structures, and a second array of electrode leads electrically connected with a second array of metal electrodes corresponding to the array of mesa structures, where the first and second arrays of metal electrodes are directly over top surfaces of the array of mesa structures and are electrically isolated from each other In an embodiment, a monopolar micro device transfer head array with metal electrodes is described. In an embodiment, a micro device transfer head array includes a base substrate, a first insulating layer over the base substrate, and an array of mesa structures over the first insulating. Each mesa structure may have a maximum width of 1 to 100 μm. A second insulating layer may be formed over the array of mesa structures, a patterned metal layer over the second insulating layer and a top surface of each mesa structure, and a dielectric layer covers the patterned metal layer on the top surface of each mesa structure. In an embodiment, the dielectric layer is formed of a high-k dielectric material such as $Al_2O_3$, $HfO_2$, $Ta_2O_5$. The patterned metal layer may further including an array of electrode leads electrically connected with the array of metal electrodes. The array of electrode leads may be further electrically connected with a metal interconnect. One or more through vias can extend through the base substrate to provide an operating voltage path to the micro device transfer head array. An insulating layer may be formed on a side surface of the through via, and a conductive layer formed within the through via and in electrical contact with the patterned metal layer. In an embodiment, the patterned metal layer includes an array of electrode leads electrically connected with an array of metal electrodes corresponding to the array of mesa structures. In an embodiment, each metal electrode completely covers a top surface of a corresponding mesa structure. In some embodiments, the conductive layer does not completely fill the through via. In an embodiment, the first insulating layer is a buried oxide layer. In an embodiment, the micro device transfer head array can be formed from an SOI substrate.

In an embodiment, a bipolar micro device transfer head array with metal electrodes is described. In an embodiment, a patterned metal layer is formed over the second insulating layer and a top surface of each mesa structure, and the patterned metal layer includes a first metal interconnect with a first array of metal electrodes electrically connected with the first metal interconnect, and a second metal interconnect with a second array of metal electrodes electrically connected with the second metal interconnect. The first and second arrays of metal electrodes can be formed directly over a top surface of the array of mesa structures, and electrically isolated from each other. A dielectric layer covers the patterned metal layer on the top surface of each mesa structure. In an embodiment, the dielectric layer is formed of a high-k dielectric material such as $Al_2O_3$, $HfO_2$, $Ta_2O_5$.

The patterned metal layer may include a first and second arrays of metal electrode leads that are parallel to one another. The first and second metal interconnects can be parallel to one another. The first and second arrays of metal electrodes may have the same surface area directly over the tops surfaces of each of the mesa structures. In an embodiment, the first array of metal electrode leads electrically connected with the first metal electrode is electrically isolated from the second array of metal electrode leads electrically connected with the second metal electrode. The first array of metal electrode leads is electrically connected with the first array of metal electrodes and the first metal interconnect, and the second array of metal electrode leads is electrically connected with the second array of metal electrodes and the second metal interconnect. A first and second through vias can extend through the base substrate to provide an operating voltage path to the micro device transfer head array. An insulating layer may be formed on a side surface of the first and second through vias. A first and second conductive layers may be formed within the first and second through via and in electrical contact with the first and second metal interconnects, respectively. In some embodiments, the first and second conductive layers do not completely fill the first and second through vias. In an embodiment, the first insulating layer is a buried oxide layer. In an embodiment, the micro device transfer head array can be formed from an SOI substrate.

BRIEF DESCRIPTION OF THE DRAWINGS

FIG. 3A is a cross-sectional side view illustration of a monopolar micro device transfer head array with metal electrodes taken along lines W-W, X-X, and Y-Y from FIG. 1 in accordance with an embodiment of the invention.

FIG. 3B is a plan view illustration of FIG. 3A taken along lines W-W, X-X, and Y-Y from FIG. 1 according to an embodiment of the invention.

FIG. 4A is a cross-sectional side view illustration of a bipolar micro device transfer head array with metal electrodes taken along lines V-V, W-W, X-X, Y-Y, and Z-Z from FIG. 2 in accordance with an embodiment of the invention.

FIG. 4B is a plan view illustration of FIG. 4A taken along lines V-V, W-W, X-X, Y-Y, and Z-Z from FIG. 2 according to an embodiment of the invention.

FIGS. 5A-15B illustrate a method of forming a bipolar micro device transfer head with metal electrodes by utilizing a dielectric layer as an etch stop in forming a mesa structure in accordance with an embodiment of the invention.

FIGS. 16A-23B illustrate a method of forming a bipolar micro device transfer head with metal electrodes by utilizing a timed etch in forming a mesa structure in accordance with an embodiment of the invention.

DETAILED DESCRIPTION OF THE INVENTION

Figure 1:
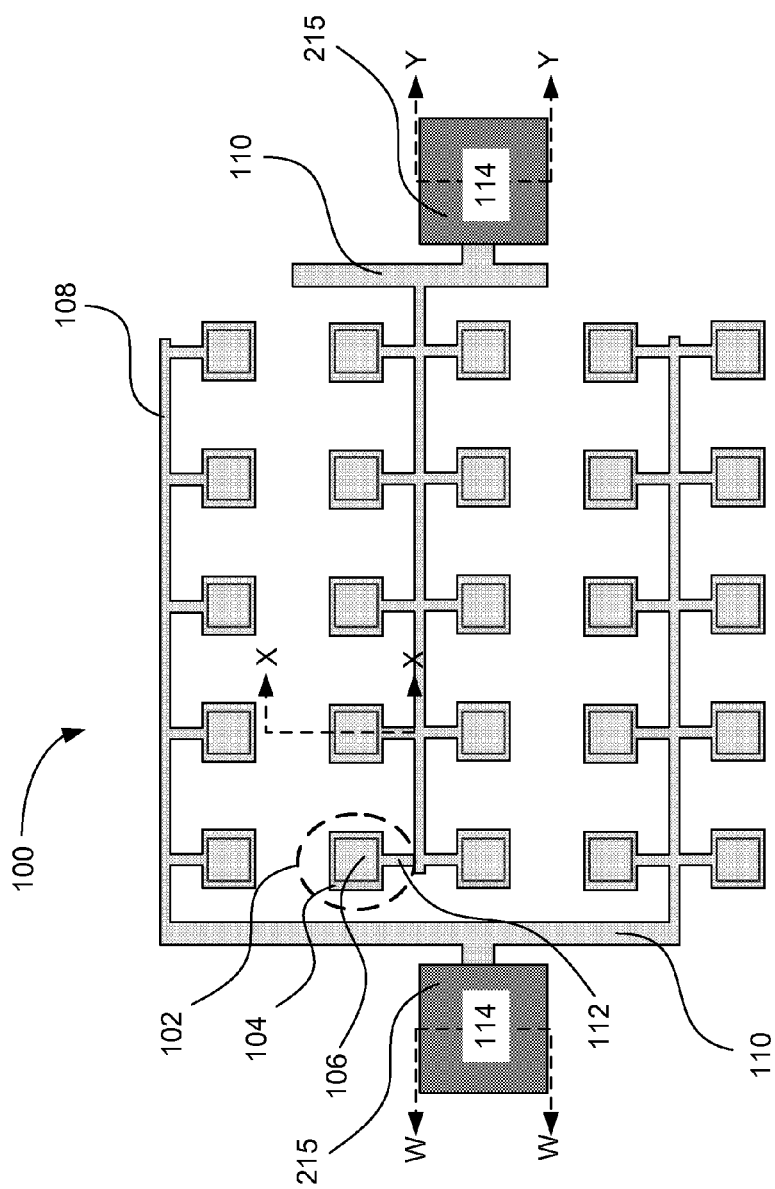
FIG. 1 is a plan view illustration of a monopolar micro device transfer head array with metal electrodes in accordance with an embodiment of the invention.

Embodiments of the present invention describe a micro device transfer head and head array with metal electrodes, and method of transferring a micro device and an array of micro devices to a receiving substrate. For example, the micro device transfer head and head array with metal electrodes may be used to transfer micro devices such as, but not limited to, diodes, LEDs, transistors, ICs, and MEMS from a carrier substrate to a receiving substrate such as, but is not limited to, a display substrate, a lighting substrate, a substrate with functional devices such as transistors or integrated circuits (ICs), or a substrate with metal redistribution lines.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the present invention. In other instances, well-known semiconductor processes and manufacturing techniques have not been described in particular detail in order to not unnecessarily obscure the present invention. Reference throughout this specification to "one embodiment," "an embodiment" or the like means that a particular feature, structure, configuration, or characteristic described in connection with the embodiment is included in at least one embodiment of the invention. Thus, the appearances of the phrase "in one embodiment," "an embodiment" or the like in various places throughout this specification are not necessarily referring to the same embodiment of the invention. Furthermore, the particular features, structures, configurations, or characteristics may be combined in any suitable manner in one or more embodiments.

The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

The terms "micro" device or "micro" LED structure as used herein may refer to the descriptive size of certain devices or structures in accordance with embodiments of the invention. As used herein, the terms "micro" devices or structures are meant to refer to the scale of 1 to 100 µm. However, it is to be appreciated that embodiments of the present invention are not necessarily so limited, and that certain aspects of the embodiments may be applicable to larger, and possibly smaller size scales. In an embodiment, a single micro device in an array of micro devices, and a single electrostatic transfer head in an array of electrostatic transfer heads both have a maximum dimension, for example length or width, of 1 to 100 µm. In an embodiment, the top contact surface of each micro device or electrostatic transfer head has a maximum dimension of 1 to 100 µm. In an embodiment, the top contact surface of each micro device or electrostatic transfer head has a maximum dimension of 3 to 20 µm. In an embodiment, a pitch of an array of micro devices, and a pitch of a corresponding array of electrostatic transfer heads is (1 to 100 µm) by (1 to 100 µm), for example a 20 µm by 20 µm, or 5 µm by 5 µm pitch. In one aspect, without being limited to a particular theory, embodiments of the invention describe micro device transfer heads and head arrays which operate in accordance with principles of electrostatic grippers, using the attraction of opposite charges to pick up micro devices. In accordance with embodiments of the present invention, a pull-in voltage is applied to a micro device transfer head in order to generate a grip pressure on a micro device and pick up the micro device.

In another aspect, embodiments of the invention describe a micro device transfer head with metal electrodes and a method of transferring micro devices with the micro device transfer head with metal electrodes. In application, as an array of micro device transfer heads with metal electrodes is lowered onto an array of micro devices, the metal electrodes receive an applied voltage. Due to the high conductivity of metal materials, the applied voltage may be transferred to the metal electrode without significant voltage loss from resistance in the metal interconnect and metal leads.

In another aspect, embodiments of the invention describe a manner of forming an array of micro device transfer heads from a commercially available silicon-on-insulator (SOI) substrate which allows for a processing sequence with minimal processing steps. Processing sequences in accordance with embodiments of the invention may incorporate simultaneous etching or oxidation operations of different features, reducing the number of masks required during processing.

In another aspect, embodiments of the invention describe a transfer head and transfer head array including vias extending through the base substrate from a backside of the base substrate to the patterned silicon layer for connecting the electrodes with working circuitry of a transfer head assembly. The processing sequence in accordance with embodiments of the invention also enables passivation of the vias extending through the base substrate with high temperature thermal oxide growth.

In yet another aspect, embodiments of the invention describe a manner for mass transfer of an array of pre-fabricated micro devices with an array of micro device transfer heads with metal electrodes. For example, the pre-fabricated micro devices may have a specific functionality such as, but not limited to, a LED for light-emission, silicon IC for logic and memory, and gallium arsenide (GaAs) circuits for radio frequency (RF) communications. In some embodiments, arrays of micro LED devices which are poised for pick up are described as having a 20 μm by 20 μm pitch, or 5 μm by 5 μm pitch. At these densities a 6 inch substrate, for example, can accommodate approximately 165 million micro LED devices with a 10 μm by 10 μm pitch, or approximately 660 million micro LED devices with a 5 μm by 5 μm pitch. A transfer tool including an array of micro device transfer heads matching an integer multiple of the pitch of the corresponding array of micro LED devices can be used to pick up and transfer the array of micro LED devices to a receiving substrate. In this manner, it is possible to integrate and assemble micro LED devices into heterogeneously integrated systems, including substrates of any size ranging from micro displays to large area displays, and at high transfer rates. For example, a 1 cm by 1 cm array of micro device transfer heads can pick up and transfer more than 100,000 micro devices, with larger arrays of micro device transfer heads being capable of transferring more micro devices.

Referring now to FIG. 1, a plan view illustration is provided for a monopolar micro device transfer head array with metal electrodes connected to vias through metal interconnects. In the particular embodiment illustrated, the shaded regions illustrate an arrangement of metal electrodes and metal interconnects as viewed from the top surface of the micro device transfer head array with metal electrodes. Structures observed within the shaded areas illustrate a mesa structure formation formed below the metal electrodes. In this manner, the plan view illustration of FIG. 1 provides detail regarding structures which are formed in more than one layer.

As illustrated, the micro device transfer head array with metal electrode 100 includes an array of transfer heads 102 connected by an arrangement of metal interconnects 108, and metal bus interconnects 110. As illustrated, metal bus interconnects 110 may be formed around a periphery or outside a working area of the transfer head array including the array of transfer heads 102. In an embodiment, each transfer head 102 includes a single metal electrode 104, with each metal electrode 104 including a mesa structure 106 and optionally a metal electrode lead 112 connected to a metal interconnect 108. The mesa structure 106 is illustrated as a structure formed within the shaded region of the metal electrode 104 to illustrate its alignment with the metal electrode 106 as the mesa structure 106 is located in a layer below the metal electrode 104.

In an embodiment, a plurality of vias 114 may be formed through the backside of the base substrate to the metal layer to make contact with the metal bus interconnects 110 in order to electrically connect the metal electrodes 104 with working circuitry of a transfer head assembly. In the embodiment illustrated in FIG. 1, the metal bus interconnects 110 on the left and right sides of the illustration may be connected to the same voltage sources as supplied from vias 114 such that each metal electrode in the monopolar micro device transfer head array is applied the same voltage during micro device pick up. In another embodiment, metal bus interconnects 110 on the left and right sides are connected to different voltage sources.

Figure 2:
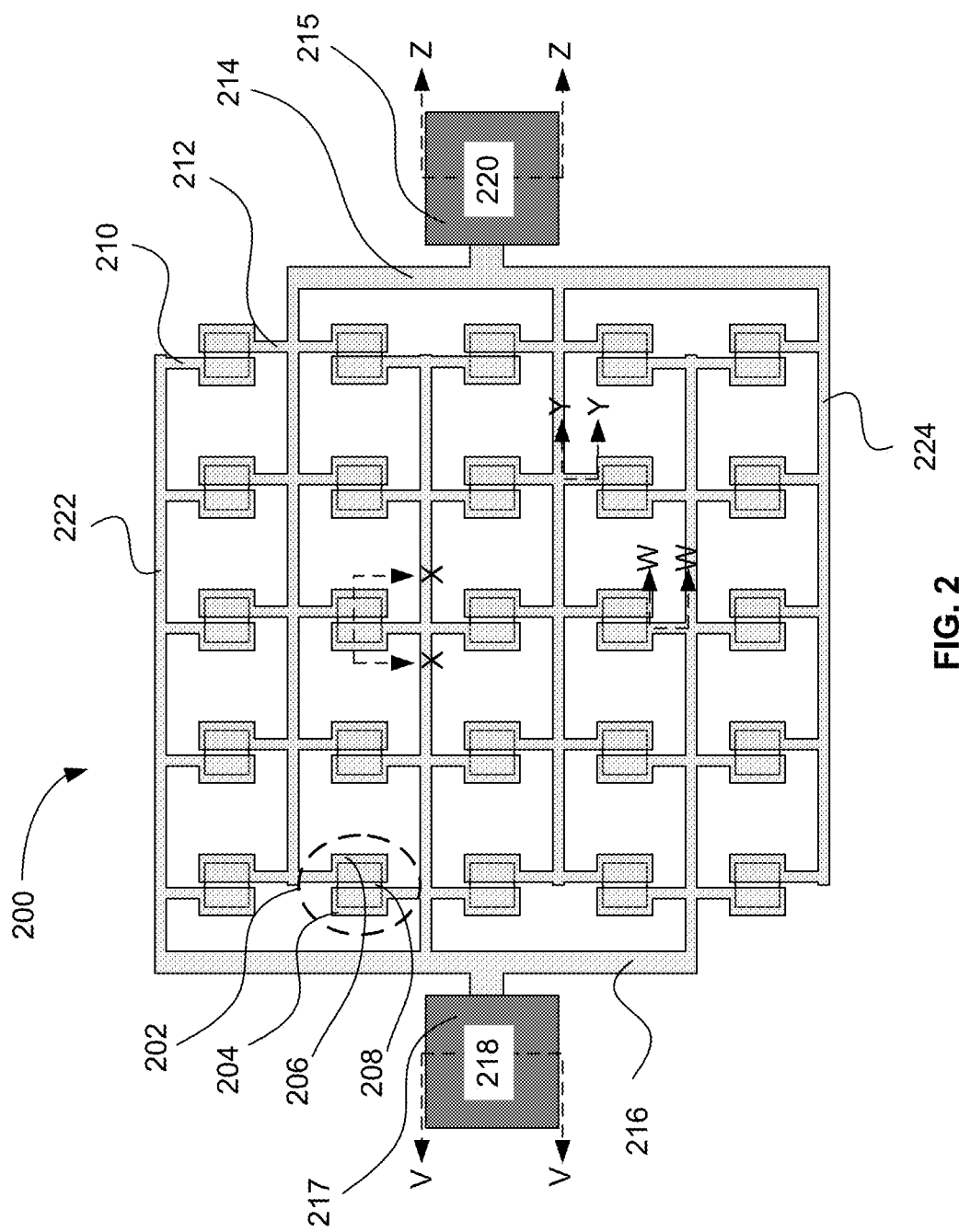
FIG. 2 is a plan view illustration of a bipolar micro device transfer head array with metal electrodes in accordance with an embodiment of the invention.

Referring now to FIG. 2, a plan view illustration is provided for a bipolar micro device transfer head array with metal electrodes connected to vias through metal interconnects. In the particular embodiment illustrated, the pixel-shaded areas illustrate an arrangement of metal electrodes and metal interconnects as viewed from the top surface of the micro device transfer head array with respect to the first of the two metal electrodes of the bipolar micro device transfer head array. The hatch-shaded areas illustrate an arrangement of metal electrodes and metal interconnects as viewed from the top surface of the micro device transfer head array with respect to the second of the two metal electrodes of the bipolar micro device transfer head array. Structures observed within the pixel-shaded and hatch-shaded areas illustrate a mesa structure formation formed below the two metal electrodes. In this manner, the plan view illustration of FIG. 2 provides detail regarding structures which are formed in more than one layer. As illustrated, the bipolar micro device transfer head array with metal electrode 200 includes an array of bipolar transfer heads 202 connected by an arrangement of first and second metal interconnects 222, 224 and first and second metal bus interconnects 216, 214. As illustrated, metal bus interconnects 216, 214 may be formed around a periphery or outside a working area of the transfer head array including the array of transfer heads 202. In an embodiment, each bipolar transfer head 202 includes two electrically separated metal electrodes—a first metal electrode 204 and a second metal electrode 206 formed over mesa structure 208 and optionally a first and second metal electrode lead 210 and 212, that are connected to first and second metal interconnects 222 and 224, respectively. The mesa structure 208 is illustrated as a structure formed within the shaded region and the hatch shaded region of first and second metal electrodes 204, 206 to illustrate its alignment with both metal electrodes as the mesa is located in a layer below both metal electrodes. In an embodiment, one or more first vias 218 and second vias 220 may be formed through the backside of the base substrate to the metal layer to make contact with the first metal bus interconnects 216 and the second metal bus interconnects 214, respectively, in order to electrically connect the first and second metal electrodes 204 and 206 with working circuitry of a transfer head assembly. In the embodiment illustrated in FIG. 2, the first metal bus interconnects 216 on the left side and the second metal bus interconnects 214 on the right side of the illustration may be connected to different voltage sources as supplied from first vias 218 and second vias 220, respectively, such that the first and second metal electrodes 204 and 206 are applied separate voltages during micro device pick up.

Referring now to FIGS. 3A and 3B, a combination plan view illustration and combination cross-sectional side view are provided taken along lines W-W, X-X, and Y-Y from FIG. 1. The combination views are not representations of the precise relative location for all of the different features illustrated, rather the combination views combine specific features at different locations in FIG. 1 in a single illustration to more easily represent the processing sequence. For example, while the cross-sectional side view illustration 300 of FIG. 3A shows one via 114 corresponding to one transfer head with metal electrode 102, it is clear from FIG. 1 that one via 114 may be electrically connected with a plurality of transfer heads with metal electrodes 102 along one or more metal interconnects 108. As illustrated, lines W-W and Y-Y are along backside vias 114. Furthermore, line X-X is along the metal electrode lead 112 and micro device transfer head with metal electrode 102

Still referring to FIG. 3A, a transfer head 102 with metal electrode 104 may include a mesa structure 106 and may optionally include a metal electrode lead 112 on a first insulating layer 324. A second insulating layer 340 may cover a top surface 346 of the mesa structure 106 to avoid electrical drift into the mesa structure 106 from the metal electrode 104. A dielectric layer 332 may cover a top surface of the metal electrode 104 as well as exposed top surfaces of metal bus interconnect 110, metal interconnect 108, and the first insulating layer 324. In an embodiment, the dielectric layer is formed of a high-k dielectric material such as $Al_2O_3$, $HfO_2$, $Ta_2O_5$. In an embodiment, the high-k dielectric material is deposited with atomic layer deposition (ALD). As used herein the term high-k dielectric material means a dielectric material featuring a dielectric constant greater than 3.9 which is the dielectric constant of $SiO_2$. Via openings 330 extend through the base substrate 326 from a backside 338 of the base substrate 326 to a topside 336 of the base substrate 326 where metal bus interconnect 110 is located. In the particular embodiment illustrated in FIG. 3A, via openings 330 extend through the first insulating layer 324 and base substrate to the metal bus interconnect 110. An insulating layer 328 is formed on the backside 338 of the base substrate 326 and on side surfaces within the via openings 330. A conductive layer 334 is further formed on the back surface of the insulating layer 328 and within the side surface of the insulating layer 328 within the via openings 330 without completely filling the via openings 330. Where base substrate is formed of silicon, the insulating layer 328 insulates electrical shorting between the vias 114. The first insulating layer 324 insulates electrical shorting between the base substrate 326 and the metal electrodes 104, metal electrode leads 112, metal interconnects 108, and metal bus interconnects 110.

Referring now to FIGS. 4A and 4B, a combination plan view illustration and combination cross-sectional side view are provided taken along lines V-V, W-W, X-X, Y-Y, and Z-Z from FIG. 2. The combination views are not representations of the precise relative location for all of the different features illustrated, rather the combination views combine specific features at different locations in FIG. 2 in a single illustration to more easily represent the processing sequence. For example, while the cross-sectional side view illustration 400 of FIG. 4A shows one via 218 corresponding to one metal electrode 204, it is clear from FIG. 2 that one via 218 may be electrically connected with a plurality of metal electrodes 204 along one or more metal interconnects 222. Likewise one via 220 may be electrically connected with a plurality of metal electrodes 206 along one or more metal interconnects 224. As illustrated, lines V-V and Z-Z are along backside vias 218 and 220 respectively. Lines W-W and Y-Y are along a first and second metal electrode leads, respectively. Furthermore, line X-X runs across the first and second metal electrodes 204 and 206, respectively.

Still referring to FIG. 4A, a bipolar transfer head 202 with first and second metal electrodes 204 and 206 may include a mesa structure 208 and may optionally include first and second metal electrode leads 210 and 212 on a first insulating layer 424. A second insulating layer 440 may cover a top surface 446 of the mesa structure 208, to avoid electrical drift into the mesa structure 208 from the first and second metal electrodes 204 and 206. First and second metal electrodes 204, 206 are separated by a gap 436, In accordance with an embodiment, electrodes 206, 208 cover the maximum amount of surface area of the top surface second insulating layer 440 over the top surface 446 of the mesa structure 208 as possible while remaining within patterning tolerances. Minimizing the amount of free space increases the capacitance and resultant grip pressure that can be achieved by the bipolar transfer head. The minimum amount of separation distance may be balanced by considerations for maximizing surface area, while avoiding overlapping electric fields from the electrodes. For example, gap 436 may be 0.5 µm or less, and the minimum separation distance may be limited by the thickness of the electrodes. A dielectric layer 432 may cover a top surface of the first and second metal electrodes 204 and 206 and first and second metal electrode leads 210 and 212, as well as exposed top surfaces of first and second metal bus interconnects 216 and 214, first and second metal interconnects 222 and 214, and the first insulating layer 424. In an embodiment, the dielectric layer is formed of a high-k dielectric material such as $Al_2O_3$, $HfO_2$, $Ta_2O_5$. In an embodiment, a high-k dielectric material is deposited with atomic layer deposition (ALD). Via openings 430 extend through the base substrate 426 from a backside 438 of the base substrate 426 to a topside 436 of the base substrate 426 where first and second metal bus interconnects 216 and 214 are located. In the particular embodiment illustrated in FIG. 4A, via openings 430 extend through the first insulating layer 424 and the base substrate to the metal bus interconnects 216 and 214. An insulating layer 428 is formed on the backside 438 of the base substrate 426 and on side surfaces within the via openings 430. First and second conductive layers 436 and 434 are further formed on the back surface of the insulating layer 428 and within the side surface of the insulating layer 428 within, but not completely filling, the first and second vias 218 and 220. Where base substrate is formed of silicon, the insulating layer 428 insulates electrical shorting between the first and second vias 218 and 220. The first insulating layer 424 insulates electrical shorting between the base substrate 426 and the first and second metal electrodes 204 and 206, first and second metal electrode leads 210 and 212, first and second metal interconnects 222 and 224, and first and second metal bus interconnects 216 and 214.

FIGS. 5A-15B illustrate a method of forming a bipolar micro device transfer head with metal electrodes including backside via openings in accordance with an embodiment of the invention. Initially, the processing sequence may begin with commercially available SOI substrate as illustrated in FIGS. 5A-5B. The SOI substrate may include base substrate 426, top silicon device layer 422, a buried oxide layer 424 between the base substrate and the top silicon device layer, and backside passivation layer 428. The buried oxide layer 424 is also referred to as the first insulating layer and the passivation layer 428 is also referred to as an insulating layer within this disclosure. In an embodiment, base substrate is a (100) silicon handle wafer having a thickness of 500 µm+/−50 µm, buried oxide layer 424 is 1 µm+/−0.1 µm thick, and top silicon device layer is 2-20 µm+/−0.5 µm thick, or more specifically approximately 5 µm. The top silicon device layer may also be doped to improve conductivity. For example, a phosphorous dopant concentration of approximately $10^{17}$ $cm^{-3}$ yields a resistivity of less than 0.1 ohm-centimeter. In an embodiment, the backside passivation layer 428 is a thermal oxide having a thickness up to approximately 2 µm thick, which is the approximate upper limit for thermal oxidation of silicon.

A mask layer 602 may then be formed over the silicon device layer 422, as illustrated in FIGS. 6A-6B. Mask layer 602 may be deposited, or alternatively thermally grown from the top silicon device layer 422. In an embodiment, mask layer 602 is a thermally grown $SiO_2$ layer having a thickness of approximately 0.1 µm. In an embodiment, where mask layer 602 is thermally grown $SiO_2$, the mask layer 602 has a thickness which is significantly less than the thickness of buried oxide ($SiO_2$) layer 424 in order to maintain structural stability for the partially patterned SOI structure during removal of the patterned mask layer.

In an embodiment, backside via openings 430 are then formed in the SOI substrate. Initially, as illustrated in FIGS. 7A-7B, the backside via openings are formed through the backside passivation layer 428 and base substrate 426, stopping on the buried oxide layer 424. In an embodiment, the backside via openings 430 illustrated in FIGS. 7A-7B are formed by applying a patterned positive photoresist on the backside passivation layer 428, followed by etching of the exposed passivation layer 428 and dry reactive ion etching (DRIE) of the base substrate 426, stopping on the buried oxide layer 424. The base substrate 426 may alternatively be etched with a wet etchant such as KOH. However, KOH wet etchant attacks silicon preferentially in the (100) plane, and may produce an anisotropic V-etch. DRIE etching may be selected for more vertical sidewalls in the backside via openings 430. After etching of the base substrate 426, the patterned positive photoresist can be removed by $O_2$ ashing followed by piranha etch resulting in the structure illustrated in FIGS. 7A-7B.

Referring to FIGS. 8A-8B, the mask layer 602 is patterned to form an array of islands 802 which will correspond to the mesa structures of the metal electrodes. In an embodiment, the mask layer is a thermally grown $SiO_2$ layer, and islands 802 are formed by applying a positive photoresist, exposing, and removing undeveloped areas of the photoresists with a potassium hydroxide (KOH) developer solution. The mask layer 602 is then dry etched to form islands 802 using a suitable technique such as ion milling, plasma etching, reactive ion etching (RIE), or reactive ion beam etching (RBIE), electron cyclotron resonance (ECR), or inductively coupled plasma (ICP), stopping on the silicon layer 422. If a high degree of anisotropic etching is not required, a dry plasma etching technique with a plasma etchant such as $CF_4$, $SF_6$, or $NF_3$ may be used. The patterned photoresist is then removed by $O_2$ ashing followed by piranha etch resulting in the structure illustrated in FIGS. 8A-8B. In an embodiment, each island 802 has a maximum dimension, for example length or width, of 1 to 100 µm. In an embodiment, each island has a maximum dimension of 3 to 20 µm. In an embodiment, a pitch between an array of islands 802 is (1 to 100 µm) by (1 to 100 µm), for example a 20 µm by 20 µm, or 5 µm by 5 µm pitch.

Referring to FIGS. 9A-9B, the array of islands 802 is used as a mask to form mesa structure 208. One of the benefits of utilizing a SOI wafer is being able to utilize the buried oxide layer 424 as an etch stop layer. The mesa structure 208 may be formed by wet etch such as with a KOH solution stopping on the buried oxide layer 424. Where layer 422 is formed of silicon, KOH wet etchant may display a greater etch rate selectivity in the (100) plane than in the (111) plane resulting in (111)-oriented sidewalls and a flat (100)-oriented bottom profile to create the slanted sidewalls of mesa structure 208. In an embodiment, a timed buffered-oxide etch (BOE) may then be applied to remove remaining oxide to obtain a buried oxide layer 424 thickness of 19000 Å. The resulting mesa structure may have a maximum width of 1 to 100 µm. In an embodiment, each mesa structure has a maximum dimension of 3 to 20 µm. In an embodiment, a pitch between an array of mesa structures is (1 to 100 µm) by (1 to 100 µm), for example a 20 µm by 20 µm, or 5 µm by 5 µm pitch.

Referring to FIGS. 10A-10B, a second insulating layer 440, 441 may be grown on the mesa structure 208 as well as inside of the backside via openings 430 by wet thermal oxidation. Prior to oxidation, the exposed surfaces of mesa structure 208 and backside via opening sidewalls may be subjected to a pre-oxide clean to remove any contaminants that may prevent or hinder oxide growth on exposed silicon material and to clean the surface for efficient oxide growth. In an embodiment, the resulting thickness from the wet thermal oxidation may be 1 µm thick.

Referring now to FIGS. 11A-11B, patterned conductive layers 436 and 434 are formed on the passivation layer 428 and insulating layer 441 within the via openings 430, and the bottom surface of the buried oxide layer 424. In an embodiment, the patterned conductive layers 436 and 434 are formed by sputtering through a shadow mask. In an embodiment, the patterned conductive layers 436 and 434 include a first layer of 1000 Å-thick titanium-tungsten (TiW), and a 1 µm to 3 µm thick outer layer of gold (Au).

Referring to FIGS. 12A-12B, first and second metal electrodes 204, 206 and first and second metal electrode leads 210, 212 are formed on a portion of the buried oxide layer 424 and on the second insulating layer 440. In an embodiment, a layer of nickel-chromium NiCr) is deposited with a thickness of 1000 Å. The layer of NiCr is then patterned by first forming a mask layer over the NiCr and subsequently wet etching the unprotected areas. The mask layer is created by applying a positive photoresist, exposing, and removing undeveloped areas of the photoresist with a KOH developer solution. In an embodiment, first and second metal interconnects 216, 214 and metal bus interconnects 218, 220 are formed simultaneously with metal electrodes 204, 206 and metal electrode leads 210, 212. It is to be appreciated that while the particular embodiments illustrated and described in FIGS. 12A-12B have been made with regard to a bipolar electrode configuration, in other embodiment a similar processing sequence can be used to form a monopolar electrode configuration. While the following description of FIGS. 13A-15A is made with regard to a bipolar configuration, it is to be appreciated that similar processing sequences may also be used to form a monopolar configuration, in accordance with embodiments of the invention.

Referring to FIGS. 13A-13B, openings 1402 are formed through the buried oxide layer 424 above patterned conductive layers 434 and 436. Openings 1402 may be formed in the first insulating layer 424 with a thick patterned positive photoresist, followed by an anisotropic dry etching of the first insulating layer 424. The patterned photoresist is then removed by $O_2$ ashing followed by piranha etch resulting in the structure in FIGS. 13A-13B.

Referring to FIGS. 14A-14B, patterned conductive layers 215, 217 are formed on a portion of the buried oxide layer 424, on a portion of the optional first and second electrode leads 210, 212, and within the openings 1402 in electrical contact with patterned conductive layers 434, 436. Prior to metal sputtering, the exposed surfaces of first insulating layer 424, patterned conductive layers 434 and 436, first and second metal electrode leads 210 and 212, and first and second electrodes 204 and 206 may be subjected to a pre-metal plasma clean to remove any contaminants that may prevent or hinder metal deposition on exposed surfaces. In an embodiment the patterned conductive layers 215, 217 are formed by sputtering NiCr through a shadow mask. In an embodiment, the patterned conductive layers 215, 217 are 1000 Å-thick.

Referring now to FIGS. 15A-15B, the front side of the SOI wafer can then be deposited with a dielectric in order to passivate the exposed buried oxide layer 424 and exposed metal layers including the metal electrodes 204, 206. In an embodiment, the dielectric material may be formed of amorphous silicon or PECVD oxide/nitride with a targeted thickness of approximately 5000 Å. The dielectric material may act as a passivation layer to seal the semiconductor structure from moisture and from the outside atmosphere. Furthermore, the dielectric material may have be formed to have a suitable thickness and dielectric constant for achieving the required grip pressure for the micro device transfer head, and sufficient dielectric strength to not break down at the operating voltage. In an embodiment, the dielectric layer is formed of a high-k dielectric material such as $Al_2O_3$, $HfO_2$, $Ta_2O_5$. In an embodiment, a high-k dielectric material is deposited with atomic layer deposition (ALD).

FIGS. 16A-23B illustrate an alternate method of forming a bipolar micro device transfer head with metal electrodes including backside via openings in accordance with an embodiment of the invention. The method illustrated in FIGS. 16A-23B continues from FIGS. 8A-8B. While the embodiments illustrated in FIGS. 16A-23B are shown as being formed from an SOI substrate, embodiments of the invention are not so limited. In other embodiments, the processing sequences described are applicable to bulk substrates, including bulk silicon substrates among other materials. The method of forming a bipolar micro device transfer head with metal electrodes including backside via openings as illustrated in FIGS. 16A-23B may be formed using a bulk silicon substrate in lieu of SOI. A bulk silicon substrate may be less expensive than a SOI substrate. Additionally, since a buried oxide layer (e.g. layer 424) is not utilized as an etch stop layer during formation of the mesa structures, one benefit of using an SOI substrate may not be necessarily be realized. Furthermore, use of a bulk silicon substrate (or other substrate) rather than a SOI substrate may allow for the formation of a continuous oxide layer at the base of the mesa structures. For example, separate oxide layers 424, 440 may not be present at the bottom surface of the mesa structures. As will become more apparent in the following description, a continuous underlying oxide layer may allow for the formation of a metal electrode 204, 206 and lead 210, 212 with reduced probability of electrical disconnects.

Referring now to FIGS. 16A-16B, the array of islands 802 is used as a mask layer to form mesa structure 208. The mesa structure 208 may be formed by a timed wet etch with a KOH solution to remove a portion (e.g. 3 µm to 4 µm) of top silicon device layer 422 and leaving a flat layer of remaining top silicon layer 1602. In an embodiment, the resulting structure is a top silicon layer 422 that has a flat remaining top silicon portion 1602 and a raised mesa structure 208. Because KOH wet etchant displays an etch rate selectivity 400 times greater in the (100) plane than in the (111) plane, it acts as more of an anisotropic etch than an isotropic etch. However, its marginally isotropic etch property creates a slightly oblique (111)-oriented sidewall and a flat (100)-oriented bottom profile to create the slanted sidewalls of mesa structure 208. In an embodiment, a timed buffered-oxide etch (BOE) may then be applied to remove islands 802 so the buried oxide layer 424, when present, remains intact. In an embodiment, buried oxide layer 424 has thickness of 19000 Å. In an embodiment, the resulting mesa structure has a maximum width of 1 to 100 µm. In an embodiment, each mesa structure has a maximum dimension of 3 to 20 µm. In an embodiment, a pitch between an array of mesa structures is (1 to 100 µm) by (1 to 100 µm), for example a 20 µm by 20 µm, or 5 µm by 5 µm pitch.

Referring to FIGS. 17A-17B, contact hole openings 1702 are formed through the remaining top silicon layer 1602 above buried oxide layer 424 and in line with the axis of backside via openings 430. Where a bulk silicon substrate is incorporated, contact hole openings 1702 are not required. Openings 1702 above the first insulating layer 424 and centered along the axis of the underlying backside via openings 430 may be formed in the top silicon layer 422 with a thick patterned positive photoresist, followed by a silicon reactive ion etch (RIE) of the top silicon layer 422 with a chemically reactive plasma. The RIE removes the unprotected areas of the top silicon layer 422 and stops at the top surface of the buried oxide layer 424. The patterned photoresist is then removed by $O_2$ ashing followed by piranha etch resulting in the structure in FIGS. 17A-17B.

Referring to FIGS. 18A-18B, a second insulating layer 440 may be grown on the top silicon layer 422, mesa structure 208, and top silicon layer 1602 by wet thermal oxidation, as well as a passivation layer 441 within the sidewalls of the backside via openings 430. Prior to oxidation, the exposed surfaces of mesa structure 208, top silicon layer 422, remaining top silicon layer 1602, and backside via opening sidewalls may be subjected to a pre-oxide clean to remove any contaminants that may prevent or hinder oxide growth on exposed silicon material and to clean the surface for efficient oxide growth. In an embodiment, the resulting thickness from the wet thermal oxidation may be 1 µm thick. Unlike the step-like formation illustrated in FIG. 10A, the interface 1802 at the edge of the mesa structure 208 and the remaining top silicon layer 1602 are the same silicon material, allowing both mesa structure 208 and remaining top silicon layer 1602 to oxidize to form a continuous second insulating layer 440.

Referring now to FIGS. 19A-19B, patterned conductive layers 436 and 434 are formed on the passivation layer 428 within the via openings 430 and on the bottom surface of the buried oxide layer 424. In an embodiment, the patterned conductive layers 436 and 434 are formed by sputtering through a shadow mask. In another embodiment, the patterned conductive layers 436 and 434 include a first layer of 1000 Å-thick titanium-tungsten (TiW), and a 1 µm to 3 µm thick outer layer of gold (Au).

Referring to FIGS. 20A-20B, first and second metal electrodes 204, 206 and first and second metal electrode leads 210, 212 are formed on a portion of the second insulating layer 440. In an embodiment, a layer of NiCr is first deposited with a thickness of 1000 Å. The layer of NiCr is then patterned by first forming a mask layer over the NiCr and subsequently wet etching the unprotected areas. The mask layer is created by applying a positive photoresist, exposing, and removing undeveloped areas of the photoresist with a KOH developer solution. Because interface between the mesa structure 208 and remaining top silicon layer 1602 is continuous, formation of the first and second electrodes 204 and 206 and optional first and second metal electrode leads 210 and 212 are likewise continuous, thereby avoiding potential for electrical discontinuity of the metal electrode at the bottom of the mesa structure 208. In an embodiment, first and second metal interconnects 216, 214 and metal bus interconnects 218, 220 are formed simultaneously with metal electrodes 204, 206 and metal electrode leads 210, 212. It is to be appreciated that while the particular embodiments illustrated and described in FIGS. 20A-20B have been made with regard to a bipolar electrode configuration, in other embodiment a similar processing sequence can be used to form a monopolar electrode configuration. While the following description of FIGS. 21A-23A is made with regard to a bipolar configuration, it is to be appreciated that similar processing sequences may also be used to form a monopolar configuration, in accordance with embodiments of the invention.

Referring to FIGS. 21A-21B, openings 2102 are formed through the buried oxide layer 424 above patterned conductive layers 434 and 436. Openings 1402 above the first insulating layer 424 centered along the axis of the underlying patterned conductive layers 434 and 436 may be formed in the first insulating layer 424 with a thick patterned positive photoresist, followed by an anisotropic dry etching of the first insulating layer 424. The patterned photoresist is then removed by $O_2$ ashing followed by piranha etch resulting in the structure in FIGS. 21A-21B.

Referring to FIGS. 22A-22B, patterned conductive layers 215, 217 are formed on a portion of the second insulating layer 440, on a portion of the optional first and second electrode leads 210, 212, and within the contact openings 2102 and in electrical contact with patterned conductive layers 434, 436. Prior to metal sputtering, the exposed surfaces of patterned conductive layers 434 and 436, first insulating layer 424, second insulating layer 440, first and second metal electrode leads 210 and 212, and first and second electrodes 204 and 206 may be subjected to a pre-metal plasma clean to remove any contaminants that may prevent or hinder metal deposition on exposed surfaces. In an embodiment the patterned conductive layers 215, 217 are formed by sputtering NiCr through a shadow mask. In an embodiment, he patterned conductive layers 215, 217 are 1000 Å-thick. In an embodiment, the metal bus interconnects 218 and 220 make ohmic contact the underlying patterned conductive layers 434 and 436.

Referring now to FIGS. 23A-23B, the front side of the SOI wafer can then be deposited with a dielectric layer 432 in order to passivate the exposed metal layers including the metal electrodes 204 and 206, and second insulating layer 440. In an embodiment, the dielectric material may be formed of amorphous silicon or PECVD oxide/nitride with a targeted thick ness of approximately 5000 Å. The dielectric material may act as a passivation layer to seal the semiconductor structure from moisture and from the outside atmosphere. Furthermore, in accordance with embodiments of the invention, the dielectric layer 432 has a suitable thickness and dielectric constant for achieving the required grip pressure for the micro device transfer head, and sufficient dielectric strength to not break down at the operating voltage. In an embodiment, the dielectric layer is formed of a high-k dielectric material such as $Al_2O_3$, $HfO_2$, $Ta_2O_5$. In an embodiment, a high-k dielectric material is deposited with atomic layer deposition (ALD).

Figure 24:
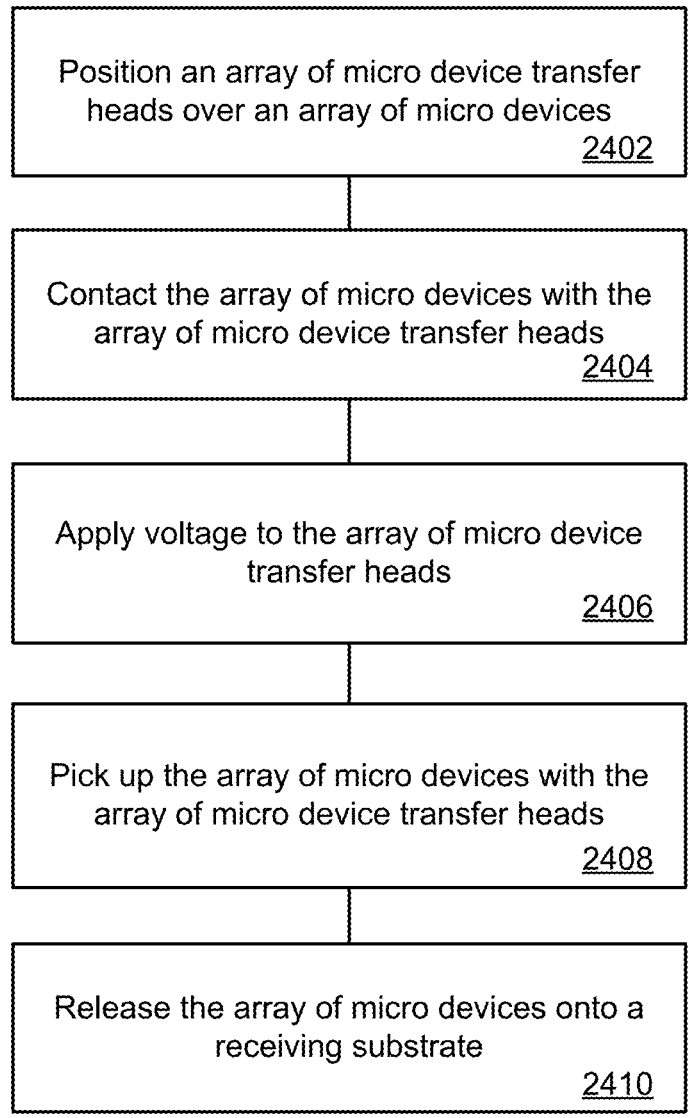
FIG. 24 is a flow chart illustrating a method of picking up and transferring an array of micro devices from a carrier substrate to a receiving substrate in accordance with an embodiment of the invention.

FIG. 24 is a flow chart illustrating a method of picking up and transferring an array of micro devices from a carrier substrate to a receiving substrate in accordance with an embodiment of the invention. At operation 2402 an array of micro device transfer heads with metal electrodes is positioned over an array of micro devices on a carrier substrate. At operation 2404 the array of micro devices are contacted with the array of micro device transfer heads. In an alternative embodiment, the array of micro device transfer heads is positioned over the array of micro devices in a suitable air gap separating them which does not significantly affect the grip pressure, for example, 1 nm to 10 nm. At operation 2406 a voltage is applied to the array of transfer heads. The voltage may be applied from a transfer head assembly in electrical connection with the array of transfer heads 102. At operation 2408 the array of micro devices is picked up with the array of transfer heads with metal electrodes. At operation 2410 the array of micro devices is then released onto a receiving substrate. For example, the receiving substrate may be, but is not limited to, a display substrate, a lighting substrate, a substrate with functional devices such as transistors or ICs, or a substrate with metal redistribution lines.

It is to be appreciated that additional operations may be performed and certain operations may be performed in a different sequence. For example, in one embodiment, an operation is performed to create a phase change in a bonding layer connecting the micro device to the carrier substrate prior to or while picking up the micro device. For example, the bonding layer may have a liquidus temperature less than 350° C., or more specifically less than 200° C. The bonding layer may be formed of a material which provides adhesion to the carrier substrate, yet also a medium from which the micro device is readily releasable. In an embodiment, the bonding layer is a material such as indium or an indium alloy. If a portion of the bonding layer is picked up with the micro device, additional operations can be performed to control the phase of the portion of the bonding layer during subsequent processing. For example, heat can be applied to the bonding layer from a heat source located within the transfer head assembly, carrier substrate, and/or receiving substrate.

Furthermore, operation 2406 of applying the voltage to create a grip pressure on the micro devices can be performed in various orders. For example, the voltage can be applied prior to contacting the array of micro devices with the array of micro device transfer heads, while contacting the micro devices with the array of micro device transfer heads, or after contacting the micro devices with the array of micro device transfer heads. The voltage may also be applied prior to, while, or after creating a phase change in the bonding layer.

Where the micro device transfer heads include bipolar metal electrodes, an alternating voltage is applied across the pair of metal electrodes in each micro device transfer head so that at a particular point when a negative voltage is applied to one metal electrode, a positive voltage is applied to the other metal electrode in the pair, and vice versa to create the pick-up pressure. Releasing the micro devices from the micro device transfer heads may be accomplished with a varied of methods including turning off the voltage sources, lowering the voltage across the pair of metal electrodes, changing a waveform of the AC voltage, and grounding the voltage sources. Release may also be accomplished by discharge associated with placing the micro devices on the receiving substrate.

In utilizing the various aspects of this invention, it would become apparent to one skilled in the art that combinations or variations of the above embodiments are possible for forming a bipolar micro device transfer head and head array, and for transferring a micro device and micro device array. Although the present invention has been described in language specific to structural features and/or methodological acts, it is to be understood that the invention defined in the appended claims is not necessarily limited to the specific features or acts described. The specific features and acts disclosed are instead to be understood as particularly graceful implementations of the claimed invention useful for illustrating the present invention.

What is claimed is:
1. A micro device transfer head array, comprising:
a base substrate;
a first insulating layer on the base substrate;
an array of electrostatic transfer heads, each electrostatic transfer head including a mesa structure over the first insulating layer, wherein each mesa structure has a maximum width of 1 to 100 μm;
a second insulating layer over a top surface of each of the mesa structures;

a patterned metal layer over the second insulating layer and the top surface of each of the mesa structures;
a through via extending through the base substrate; and
a dielectric layer covering the patterned metal layer on the top surface of each of the mesa structures.

2. The micro device transfer head array of claim 1, further comprising an insulating layer covering a side surface of the through via.

3. The micro device transfer head array of claim 1, further comprising a conductive layer within the through via and in electrical connection with the patterned metal layer.

4. The micro device transfer head array of claim 3, wherein the conductive layer does not completely fill the through via.

5. The micro device transfer head array of claim 3, wherein the patterned metal layer comprises an array of electrode leads electrically connected with an array of metal electrodes corresponding to the array of electrostatic transfer heads.

6. The micro device transfer head array of claim 5, wherein each metal electrode completely covers a top surface of a corresponding mesa structure.

7. The micro device transfer head array of claim 1, further comprising a second through via extending through the base substrate.

8. The micro device transfer head array of claim 7, further comprising a second conductive layer within the second through via and in electrical connection with the patterned metal layer.

9. The micro device transfer head array of claim 8, wherein the patterned metal layer comprises:
a first array of electrode leads electrically connected with a first array of metal electrodes corresponding to the array of electrostatic transfer heads; and
a second array of electrode leads electrically connected with a second array of metal electrodes corresponding to the array of electrostatic transfer heads;
wherein the first and second arrays of metal electrodes are directly over the top surfaces of the corresponding mesa structures of the array of electrostatic transfer heads, and the first and second arrays of metal electrodes are electrically isolated from each other.

10. The micro device transfer head array of claim 1, wherein the dielectric layer is formed of a high-k dielectric material.

11. A micro device transfer head array, comprising:
a base substrate;
a first insulating layer over the base substrate;
an array of electrostatic transfer heads, each electrostatic transfer head including a mesa structure over the first insulating layer, wherein each mesa structure has a maximum width of 1 to 100 µm;
a second insulating layer over the array of mesa structures;
a patterned metal layer over the second insulating layer and a top surface of each of the mesa structures; and
a dielectric layer covering the patterned metal layer on the top surface of each of the mesa structures.

12. The micro device transfer head array of claim 11, wherein the patterned metal layer further comprises an array of electrode leads electrically connected with an array of metal electrodes.

13. The micro device transfer head array of claim 12, wherein the array of electrode leads is electrically connected with a metal interconnect.

14. The micro device transfer head array of claim 11, further comprising a through via extending through the base substrate.

15. The micro device transfer head array of claim 14, further comprising an insulating layer covering a side surface of the through via.

16. The micro device transfer head array of claim 15, further comprising a conductive layer within the through via and in electrical connection with the patterned metal layer.

17. The micro device transfer head array of claim 16, wherein the conductive layer does not completely fill the through via.

18. The micro device transfer head array of claim 11, wherein the first insulating layer is a buried oxide layer.

19. The micro device transfer head array of claim 18, wherein the patterned metal layer comprises an array of electrode leads electrically connected with an array of metal electrodes corresponding to the array of electrostatic transfer heads.

20. The micro device transfer head array of claim 19, wherein each metal electrode completely covers the top surface of a corresponding mesa structure.

21. The micro device transfer head array of claim 11, wherein the dielectric layer is formed of a high-k dielectric material.

* * * * *